(12) United States Patent
Shiroiwa et al.

(10) Patent No.: US 8,248,584 B2
(45) Date of Patent: Aug. 21, 2012

(54) EXPOSURE APPARATUS AND DEVICE MANUFACTURING METHOD

(75) Inventors: Masataro Shiroiwa, Kawasaki (JP); Hiroki Suzukawa, Koganei (JP)

(73) Assignee: Canon Kabushiki Kaisha, Tokyo (JP)

( * ) Notice: Subject to any disclaimer, the term of this patent is extended or adjusted under 35 U.S.C. 154(b) by 707 days.

(21) Appl. No.: 12/395,487

(22) Filed: Feb. 27, 2009

(65) Prior Publication Data
US 2009/0225292 A1    Sep. 10, 2009

(30) Foreign Application Priority Data

Mar. 4, 2008  (JP) ................. 2008-054065

(51) Int. Cl.
*G01B 11/00* (2006.01)
*G03B 27/32* (2006.01)
*G03B 27/42* (2006.01)
*G03B 27/60* (2006.01)
*G06F 19/00* (2011.01)

(52) U.S. Cl. ............ 355/77; 355/52; 355/53; 356/401; 438/908; 700/112; 700/121

(58) Field of Classification Search ............... 250/559.1, 250/559.29; 355/27, 40–41, 52–53, 77; 356/399–401, 614–617, 620; 382/145, 147, 382/151; 414/935–936; 430/22; 438/908; 700/121, 124, 57, 96, 112; 702/150, 152, 702/167
See application file for complete search history.

(56) References Cited

U.S. PATENT DOCUMENTS

| | | | |
|---|---|---|---|
| 6,278,957 B1 | 8/2001 | Yasuda | |
| 6,876,946 B2 | 4/2005 | Yasuda | |
| 2001/0049589 A1 | 12/2001 | Yasuda | |
| 2002/0042664 A1 | 4/2002 | Kikuchi | |
| 2004/0126004 A1 | 7/2004 | Kikuchi | |
| 2008/0294282 A1* | 11/2008 | Koshti et al. | 700/121 |

FOREIGN PATENT DOCUMENTS

| | | |
|---|---|---|
| JP | 04-063417 A | 2/1992 |
| JP | 10-055949 A | 2/1998 |
| JP | 2001-345243 A | 12/2001 |
| JP | 2002-222752 A | 8/2002 |
| JP | 3451607 B | 9/2003 |
| JP | 2005-148531 A | 6/2005 |

* cited by examiner

*Primary Examiner* — Hung Henry Nguyen
*Assistant Examiner* — Colin Kreutzer
(74) *Attorney, Agent, or Firm* — Canon USA Inc IP Division

(57) ABSTRACT

An apparatus comprises a grouping unit dividing substrates into groups, and determining reference and non-reference substrates for each group, a measurement unit measuring a first number of points for the reference substrate, and measuring a second number, smaller than the first number, of points for the non-reference substrate, a correction value determining unit determining a first correction value to position the reference substrate, and a second correction value to position the non-reference substrate, and an exposure unit exposing the reference substrate by positioning it based on the first correction value, and exposing the non-reference substrate by positioning it based on the second correction value, the correction value determining unit determining the first correction value based on the measurement of the reference substrate, and determining the second correction value based on the measurement of the non-reference substrate, and the measurement of the reference substrate or the first correction value.

7 Claims, 13 Drawing Sheets

FIG. 9

WAFER INFORMATION MANAGING TABLE

| WAFER ID | WF001 | WF002 | WF003 | WF004 | WF005 | WF006 |
|---|---|---|---|---|---|---|
| GROUP ID | WFG001 | WFG001 | WFG002 | WFG001 | WFG002 | WFG002 |
| WAFER TYPE | MASTER | SLAVE | MASTER | SLAVE | SLAVE | SLAVE |

901 — WAFER ID
902 — GROUP ID
903 — WAFER TYPE

FIG. 10

WAFER CORRECTION VALUE MANAGING TABLE

| WAFER ID | $WF_x$ |
| WAFER SHIFT CORRECTION VALUE (WS) | $ws_x$ |
| WAFER ROTATION ERROR CORRECTION VALUE (WR) | $wr_x$ |
| WAFER MAGNIFICATION ERROR CORRECTION VALUE (WM) | $wm_x$ |
| WAFER ORTHOGONALITY CORRECTION VALUE (WO) | $wo_x$ |

1001 — WAFER ID
1002 — WAFER SHIFT CORRECTION VALUE (WS)
1003 — WAFER ROTATION ERROR CORRECTION VALUE (WR)
1004 — WAFER MAGNIFICATION ERROR CORRECTION VALUE (WM)
1005 — WAFER ORTHOGONALITY CORRECTION VALUE (WO)

WAFER INFORMATION MANAGING TABLE

| WAFER ID | WF001 | WF002 | WF003 | WF004 | WF005 | WF006 |
|---|---|---|---|---|---|---|
| GROUP ID | WFG001 | WFG001 | WFG002 | WFG001 | WFG002 | OUT |
| WAFER TYPE | SLAVE | MASTER | MASTER | SLAVE | SLAVE | MASTER |
| WAFER CORRECTION VALUE | wc001 | wc002 | wc003 | wc004 | wc005 | wc006 |

1401, 1402, 1403, 1404

EXPOSURE APPARATUS AND DEVICE
MANUFACTURING METHOD

BACKGROUND OF THE INVENTION

1. Field of the Invention

The present invention relates to an exposure apparatus which exposes a substrate to radiant energy, and a device manufacturing method using the same.

2. Description of the Related Art

Generally, a semiconductor device is manufactured by performing an exposure process a plurality of number of times for a wafer in the process of manufacturing a semiconductor device. It is therefore necessary to align (overlay) the wafer with an existing circuit pattern in an exposure process of the second and subsequent times. Along with an increase in the packing density of circuits, the recent circuit pattern is required to be fine on the order of nanometers. To meet this demand, alignment between the reticle and the wafer is very important and must be performed with high precision.

The misalignment components between the reticle and the wafer, which are measured in alignment, include:

Wafer Shift

This represents an error in which the wafer shifts in the X or Y direction (FIG. 2).

Wafer Rotation Error

This represents the degree of rotation of the wafer about its center (FIG. 3).

Wafer Magnification Error

This represents an error due to expansion/contraction of the wafer (FIG. 4).

Wafer Orthogonality

This represents an error in which the angle between the X- and Y-axes on the wafer deviates from 90° (FIG. 5).

Conventionally, if a plurality of wafers are to undergo an exposure process, misalignment amount measurement and correction value calculation are performed for each wafer in order to determine correction values for alignment. For precise alignment, it is necessary to calculate correction values by increasing the number of measurement points on the wafer. However, an increase in the number of times of measurement decreases the throughput.

Japanese Patent No. 3451607 determines correction values for wafers in the same lot in the following way. A large number of points in each sample shot on at least one wafer Wk−i of the (k−1)th and preceding wafers are accurately measured and calculated using two alignment sensors, and the measurement and calculation results are saved. Only one point in each sample shot on each of the kth and succeeding wafers is measured using one alignment sensor. Correction values are calculated based on both the measurement results of the wafer Wk−i and the kth and succeeding wafers, thereby ensuring high-precision alignment.

Japanese Patent Laid-Open No. 2001-345243 measures the positions of all shots for each of wafers preceding the nth wafer, separates the misalignment components into nonlinear components and linear components, and holds the misalignment components corresponding to the nonlinear components. For each of the nth and succeeding wafers, linear components are calculated and used, and non-linear components held in advance are used. With this operation, an improvement in the throughput and high-precision alignment are ensured.

If all wafers in the lot have equal misalignment components, a method of decreasing the number of measurement points on the kth wafer by using correction values for the (k−1)th and preceding wafers in exposing the kth wafer, as mentioned above, contributes to an improvement in the throughput. When all wafers in the lot have undergone an exposure process in the same manufacturing line, they are expected to have equal misalignment components.

However, if a plurality of manufacturing lines are used for one wafer in accordance with a difference in required exposure precision in order to improve the overall throughput in the factory, wafers from different manufacturing lines may mix in one lot. If not all wafers in the lot have equal misalignment components, existing correction values cannot be used suitably. When the existing correction values are adopted despite this, a defective product may be manufactured. Eventually, correction values must be calculated by setting a large number of measurement points for all wafers.

SUMMARY OF THE INVENTION

The present invention has been made in consideration of the above-mentioned analysis, and has as its exemplary object to provide a preferable technique for obtaining a high throughput while ensuring a required overlay precision.

According to the first aspect of the present invention, there is provided an exposure apparatus which exposes a substrate to radiant energy, the apparatus comprising a grouping unit configured to divide a plurality of substrates into a plurality of groups in accordance with characteristics of the plurality of substrates, and determine a reference substrate and a non-reference substrate for each of the plurality of groups, a measurement unit configured to measure a first number of measurement points for the reference substrate, and measure a second number of measurement points for the non-reference substrate, the second number being smaller than the first number, a correction value determining unit configured to determine a first correction value to position the reference substrate, and a second correction value to position the non-reference substrate, and an exposure unit configured to expose the reference substrate to radiant energy by positioning the reference substrate based on the first correction value, and expose the non-reference substrate to radiant energy by positioning the non-reference substrate based on the second correction value, wherein the correction value determining unit is configured to determine the first correction value for each of the plurality of groups based on measurement for the reference substrate performed by the measurement unit, and determines the second correction value for each of the plurality of groups based on measurement for the non-reference substrate performed by the measurement unit, and one of the measurement for the reference substrate performed by the measurement unit and the first correction value.

According to the second aspect of the present invention, there is provided an exposure apparatus which includes a measurement unit, measures a first number of measurement points for a reference wafer by the measurement unit, measures a second number of measurement points for a non-reference substrate by the measurement unit, the second number being smaller than the first number, determines a first correction value to position the reference substrate, based on measurement for the reference substrate performed by the measurement unit, determines a second correction value to position the non-reference substrate, based on measurement for the non-reference substrate performed by the measurement unit and one of the measurement for the reference substrate performed by the measurement unit and the first correction value, exposes the reference substrate to radiant energy by positioning the reference substrate based on the first correction value, and exposes the non-reference substrate to radiant energy by positioning the non-reference substrate based on the second correction value, the apparatus comprising a processor configured to divide a plurality of substrates into a plurality of groups in accordance with characteristics of the plurality of substrates, and determine the reference substrate and the non-reference substrate for each of the plurality of groups.

According to the third aspect of the present invention, there is provided a method of manufacturing a device, the method comprising exposing a substrate to radiant energy using an exposure apparatus as defined above, developing the exposed substrate, and processing the developed substrate to manufacture the device.

According to the fourth aspect of the present invention, there is provided an exposure method including a first measurement step of measuring a first number of measurement points for a reference substrate, a first determination step of determining a first correction value to position the reference substrate, based on measurement for the reference substrate performed in the first measurement step, a first exposure step of exposing the reference substrate to radiant energy by positioning the reference substrate based on the first correction value, a second measurement step of measuring a second number of measurement points for a non-reference substrate, the second number being smaller than the first number, a second determination step of determining a second correction value to position the non-reference substrate, based on measurement for the non-reference substrate performed in the second measurement step, and one of the measurement for the reference substrate performed in the first measurement step and the first correction value, and a second exposure step of exposing the non-reference substrate by positioning the non-reference substrate based on the second correction value, the method comprising a grouping step of dividing a plurality of substrates into a plurality of groups in accordance with characteristics of the plurality of substrates, and determining the reference substrate and the non-reference substrate for each of the plurality of groups.

Further features of the present invention will become apparent from the following description of exemplary embodiments with reference to the attached drawings.

BRIEF DESCRIPTION OF THE DRAWINGS

FIG. 9 is a table showing an example of a wafer information managing table managed by a managing unit;

FIG. 10 is a table showing an example of a wafer correction value managing table managed by the managing unit;

DESCRIPTION OF THE EMBODIMENTS

Preferred embodiments of the present invention will be described below with reference to the accompanying drawings.

Figure 1:
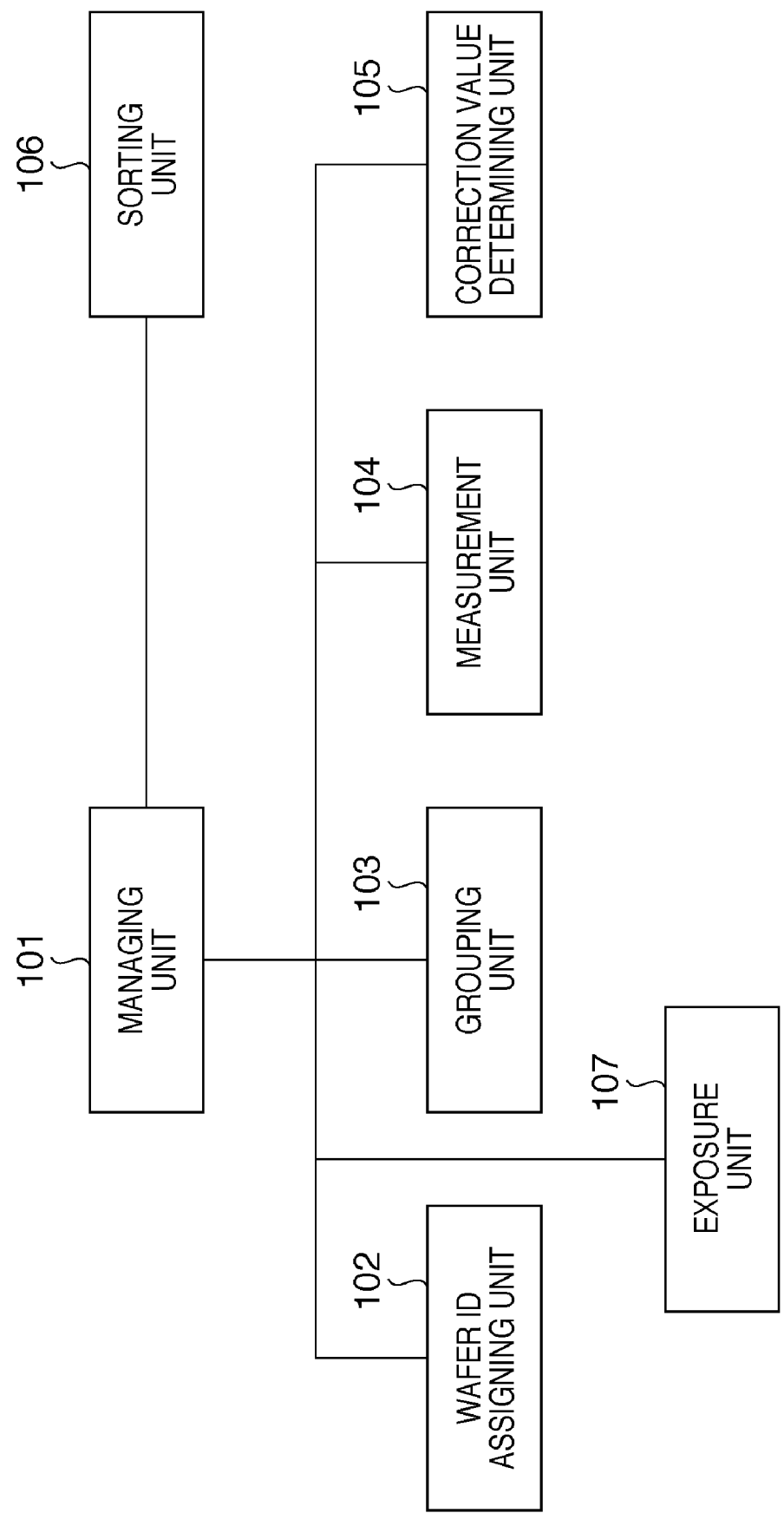
FIG. 1 is a block diagram showing the schematic configuration of an exposure apparatus according to a preferred embodiment of the present invention.
Figure 2:
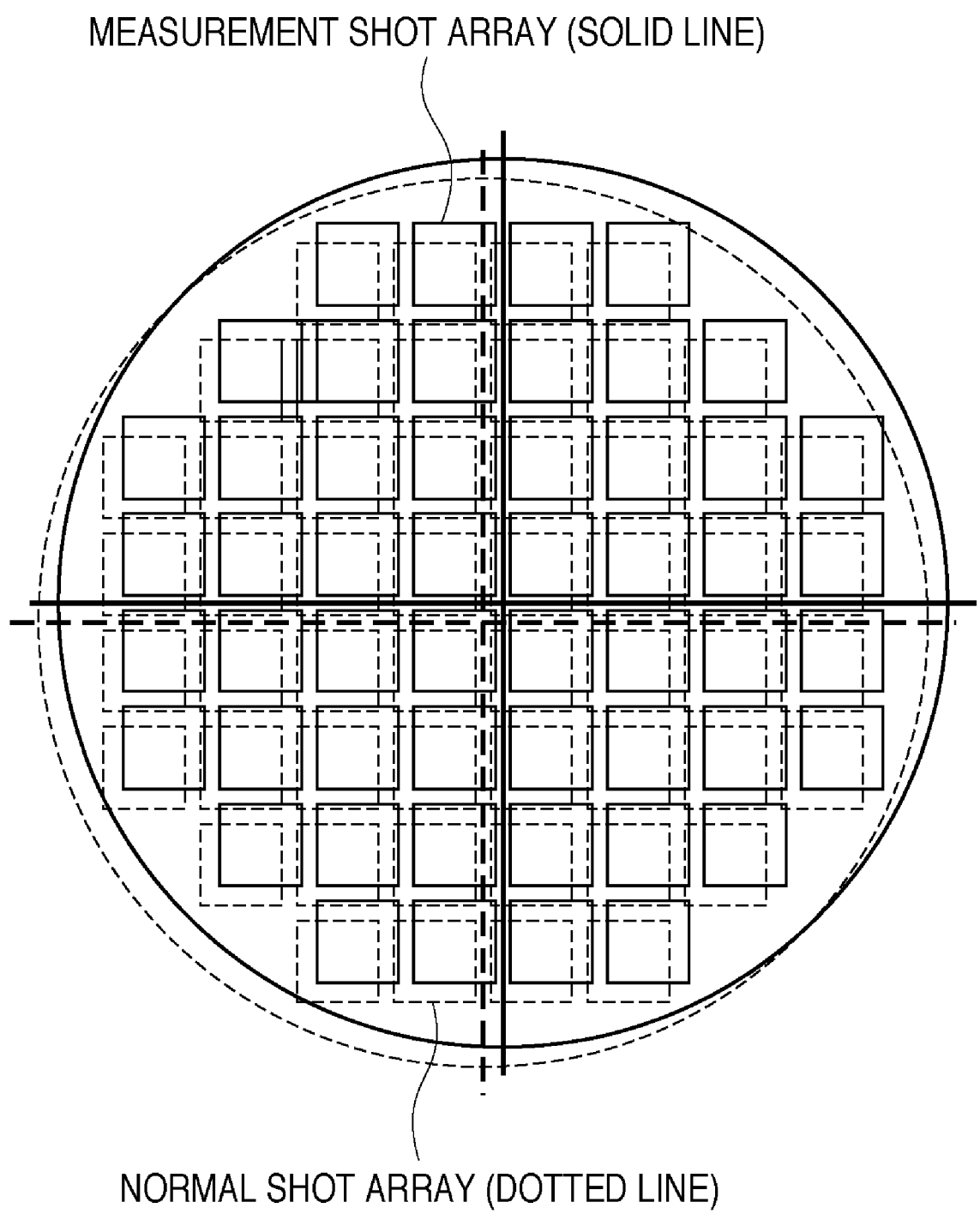
FIG. 2 is an explanatory view of a wafer shift.
Figure 3:
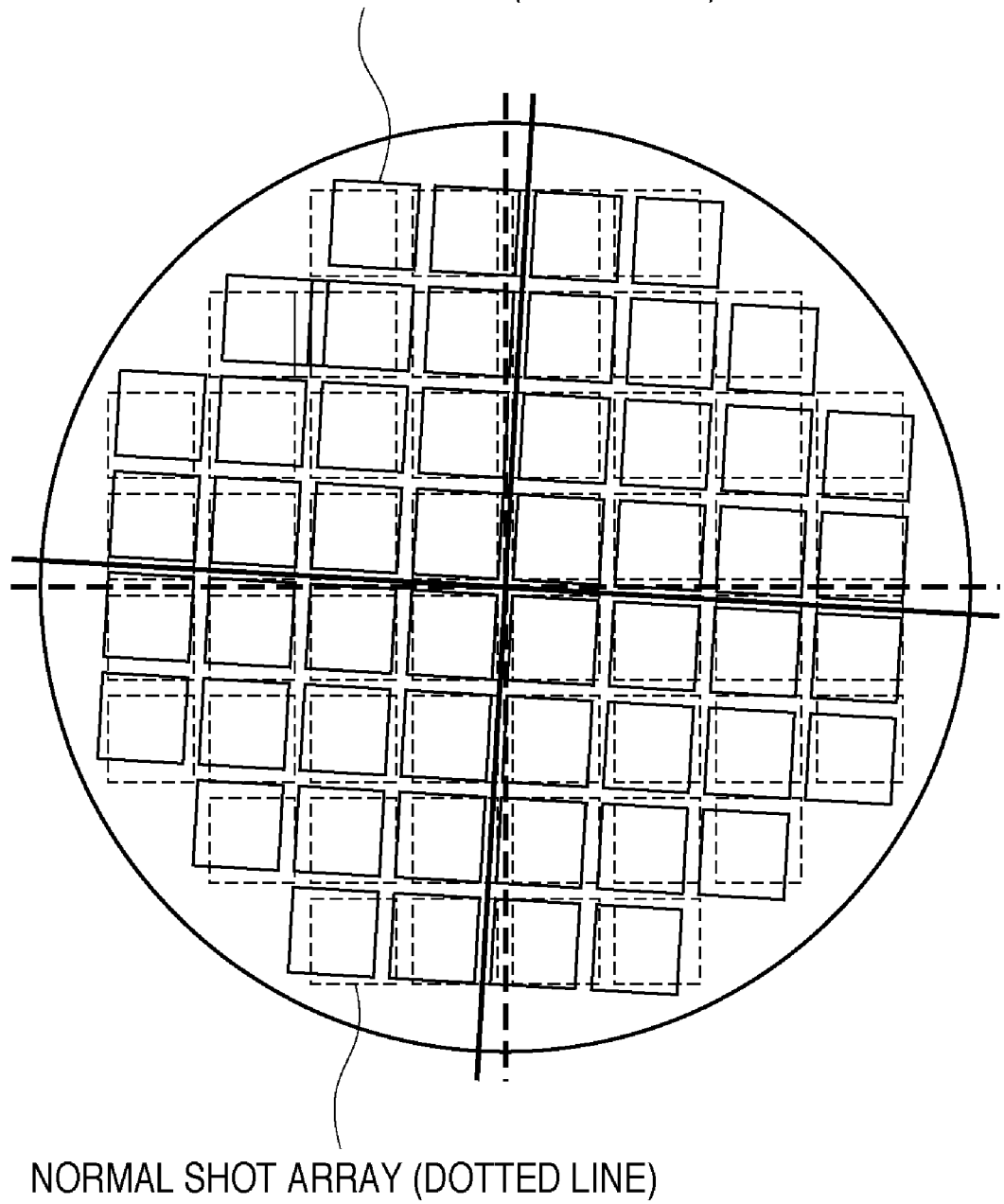
FIG. 3 is an explanatory view of a wafer rotation error.
Figure 4:
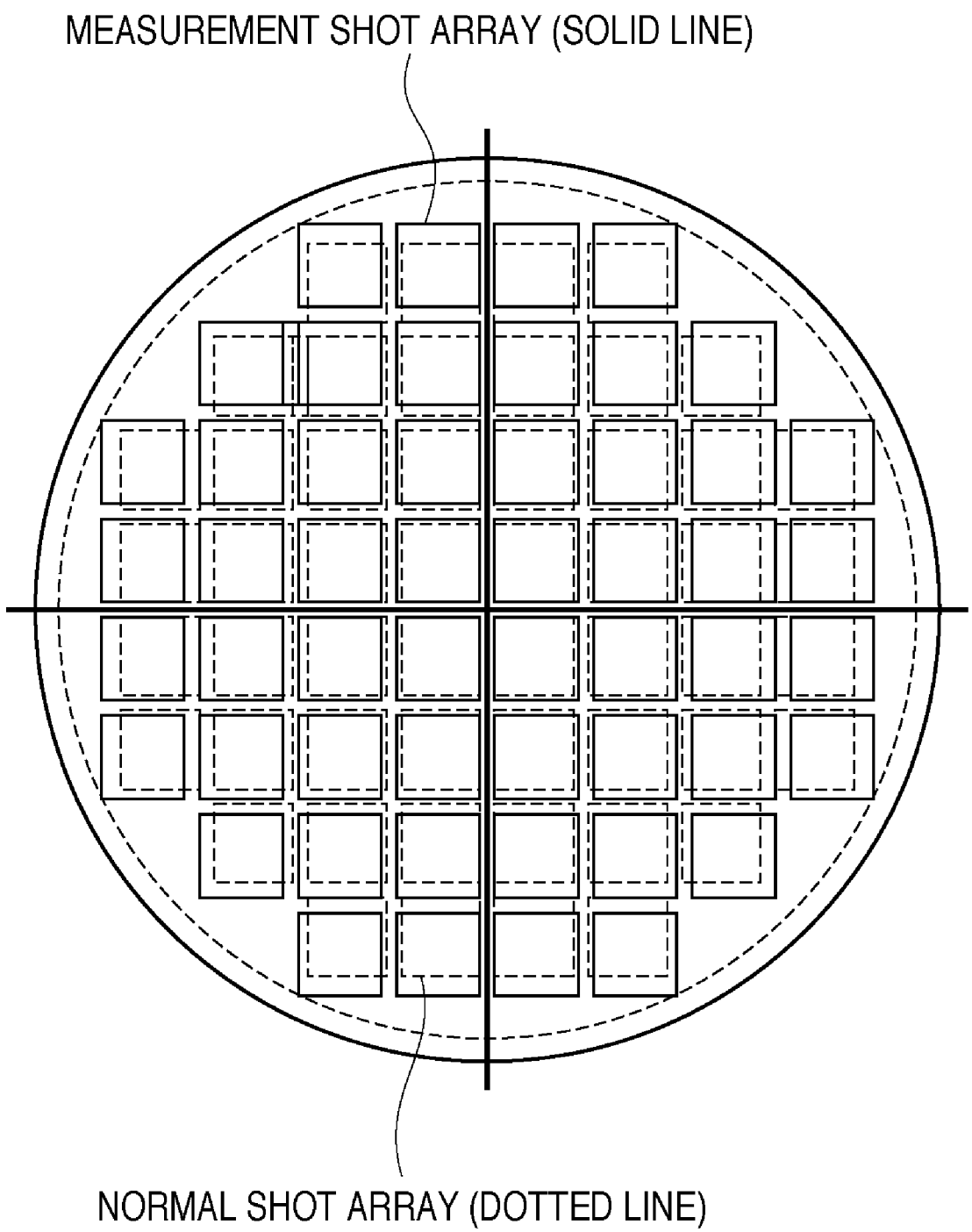
FIG. 4 is an explanatory view of a wafer magnification error.
Figure 5:
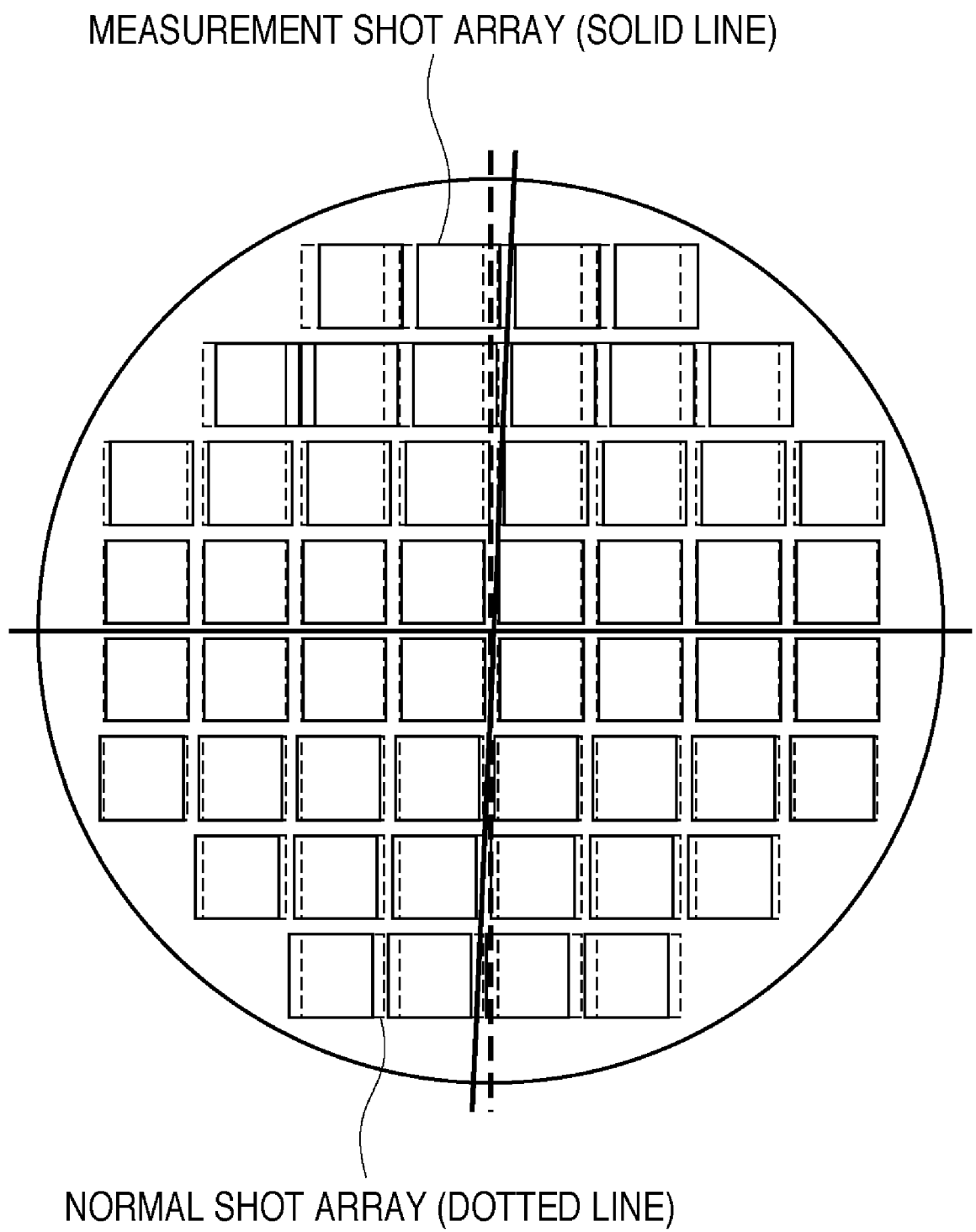
FIG. 5 is an explanatory view of a wafer orthogonality.

FIG. 1 is a block diagram showing the schematic configuration of an exposure apparatus according to a preferred embodiment of the present invention. The exposure apparatus is configured to project the pattern of a reticle (original) onto a wafer (substrate) by a projection optical system, thereby exposing the wafer to radiant energy. The exposure apparatus can include, for example, a managing unit 101, wafer ID assigning unit 102, grouping unit 103, measurement unit 104, correction value determining unit 105, and exposure unit 107. The exposure unit 107 can include the major components, for projecting the pattern of a reticle (original) onto a wafer (substrate) by a projection optical system to expose the wafer to radiant energy, such as an illumination optical system for illuminating the reticle, a reticle stage, a projection optical system, and a wafer stage.

The managing unit 101, wafer ID assigning unit 102, grouping unit 103, and correction value determining unit 105 can be configured by a computer (information processing device). The measurement unit 104 can include, for example, an alignment sensor. A sorting unit 106 can include hardware for sorting wafers, such as a robot which manipulates wafers.

The managing unit 101 manages various types of information of each wafer (substrate) using a wafer ID assigned to the wafer and a group ID assigned to a group including the wafer. The wafer ID assigning unit 102 assigns a unique wafer ID to each wafer, and registers the wafer IDs in the managing unit 101.

The grouping unit 103 divides the wafers into a plurality of groups in accordance with the wafer characteristics, assigns a unique group ID to each group, and determines wafer types representing the discrimination between a reference wafer (reference substrate) as a representative of the group and other non-reference wafers (non-reference substrates). The grouping unit 103 registers the group IDs and the wafer types in the managing unit 101.

The measurement unit 104 measures a first number of measurement points for a reference wafer in order to precisely obtain a correction value. The measurement unit 104 measures measurement points in a second number smaller than the first number for a non-reference wafer in order to improve the throughput.

The correction value determining unit 105 determines a first correction value to position a reference wafer, based on the measurement value of the reference wafer. The correction value determining unit 105 determines a second correction value for a non-reference wafer based on the measurement result of the non-reference wafer, and the measurement result of a reference wafer belonging to the same group as the non-reference wafer or the first correction value determined based on it. The determined correction values are registered in the managing unit 101.

Figure 6:
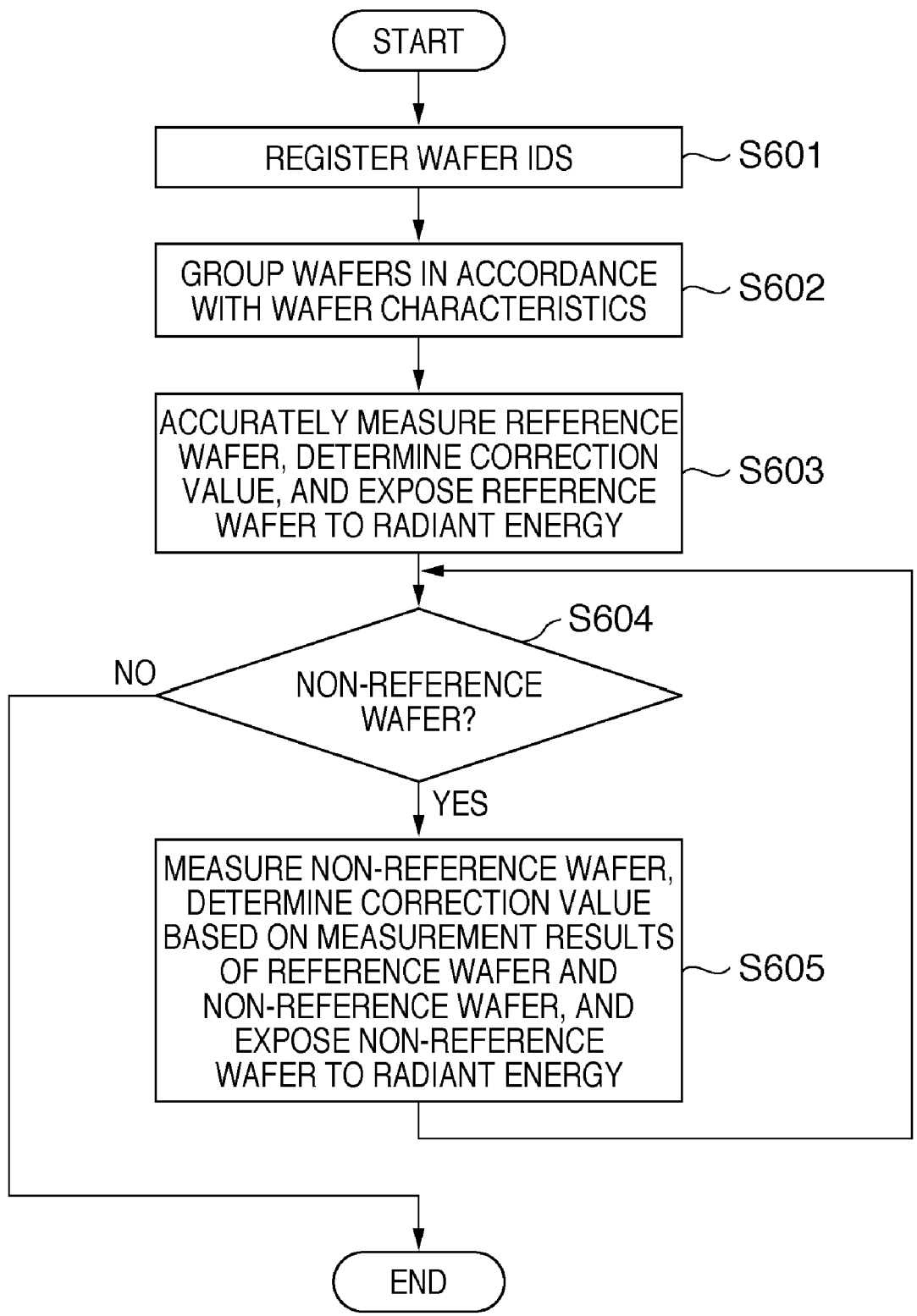
FIG. 6 is a flowchart illustrating the sequence of an exposure process according to a preferred embodiment of the present invention.

FIG. 6 is a flowchart illustrating a process by the exposure apparatus according to a preferred embodiment of the present invention. In step S601, the wafer ID assigning unit 102 assigns a unique wafer ID to each of a plurality of wafers input as a lot, and registers the wafer IDs in the managing unit 101.

In step S602, the grouping unit 103 divides the plurality of wafers into a plurality of groups in accordance with the wafer characteristics, and assigns a unique group ID to each group. Moreover, the grouping unit 103 determines wafer types representing a reference wafer as a representative of the group and other non-reference wafers, and registers the group IDs and the wafer types in the managing unit 101.

In step S603, the measurement unit 104 measures a first number of measurement points on the reference wafer in the group, determines a correction value based on the measurement result, and registers the correction value in the managing unit 101. The exposure unit 107 exposes the reference wafer to radiant energy while positioning it based on the correction value.

In step S604, it is checked whether there is a non-reference wafer in the lot. Step S605 is executed until there is no further non-reference wafer in the lot. In step S605, the measurement unit 104 measures a second number (second number<first number) of measurement points on the non-reference wafer. In this manner, the throughput improves by using a smaller number of measurement points for a reference wafer than for a non-reference wafer. The correction value determining unit 105 determines a second correction value for a non-reference wafer based on the measurement result of the non-reference wafer and the measurement result of the reference wafer or the first correction value, and registers the second correction value for the non-reference wafer in the managing unit 101. The exposure unit 107 exposes the non-reference wafer while positioning it based on the second correction value.

First Embodiment

Figure 7:
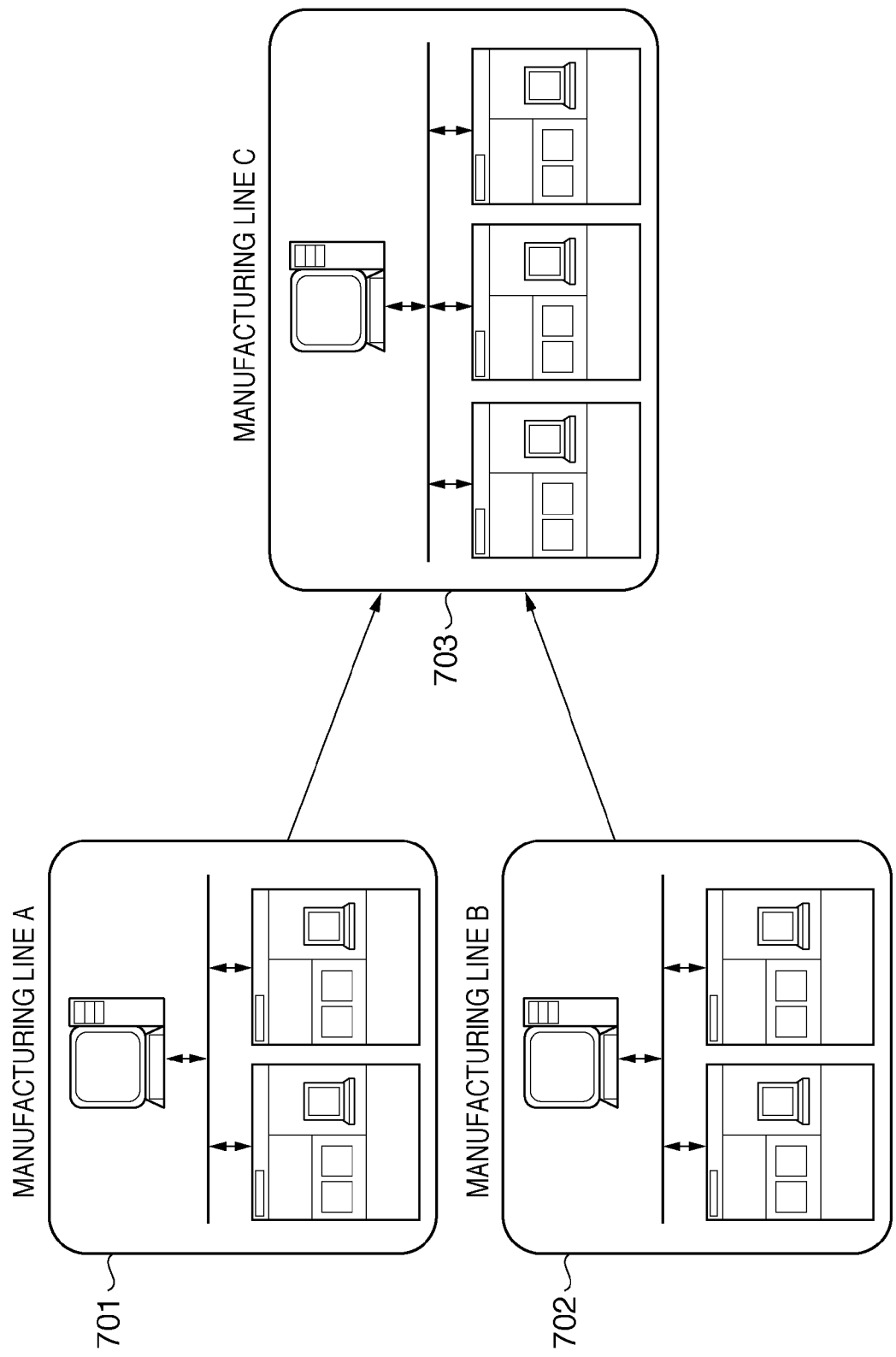
FIG. 7 is a diagram showing an example of the configuration of manufacturing lines and manufacturing planning.

The first embodiment of the present invention will be explained with reference to FIGS. 1, 7, 8, 9, 10, and 11. This embodiment shows an example in which a wafer is manufactured in a plurality of manufacturing lines, as illustrated in FIG. 7. More specifically, an exposure process performed in a manufacturing line C 703 of manufacturing planning in which a wafer processed in a manufacturing line A 701 or B 702 is processed in the manufacturing line C 703 will be explained in this embodiment. In this embodiment, the manufacturing lines A 701 and B 702 are assumed to apply equivalent processes to the wafer.

Figure 8:
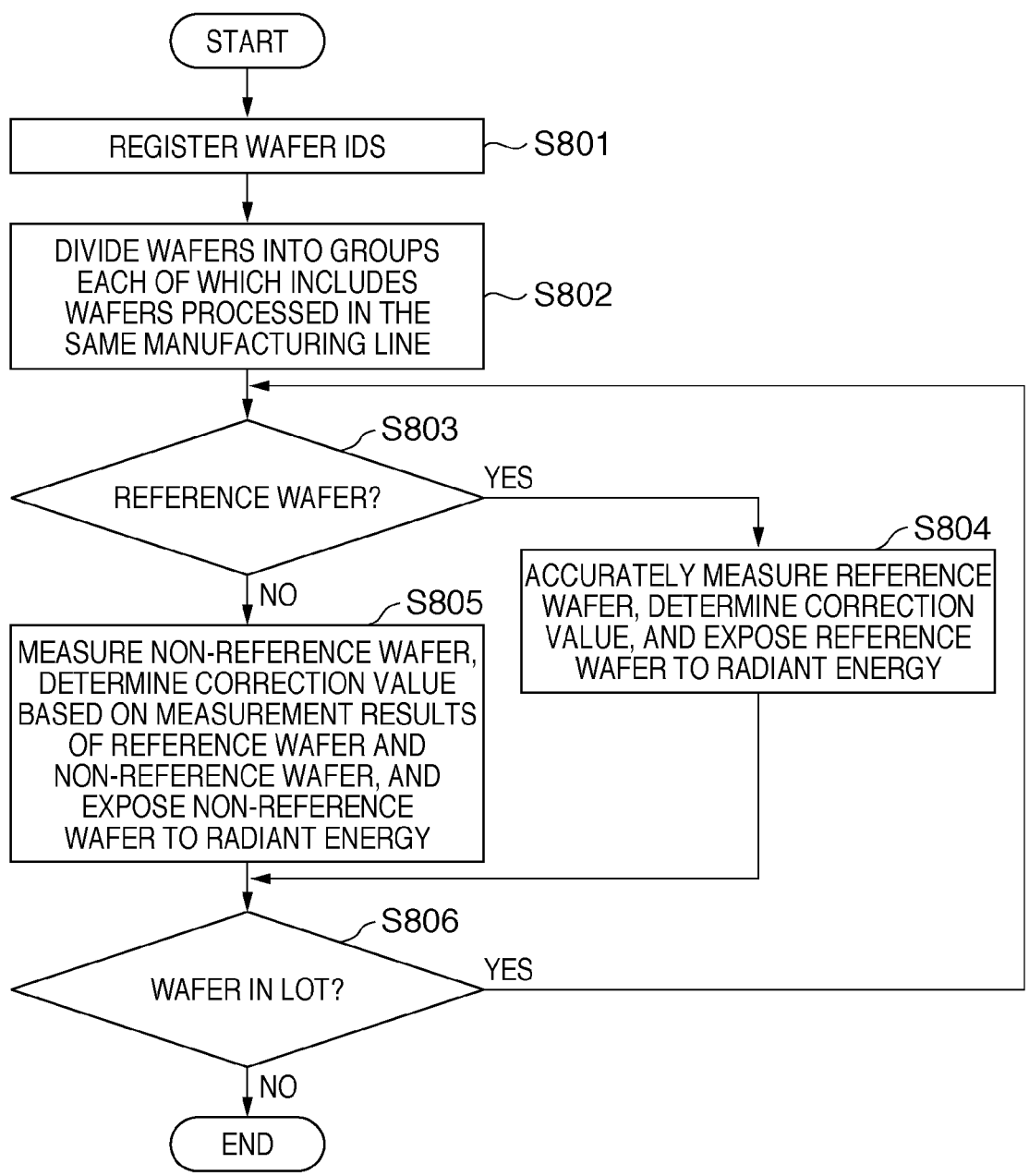
FIG. 8 is a flowchart illustrating an exposure process according to the first embodiment of the present invention.

FIG. 8 is a flowchart illustrating an exposure process according to the first embodiment of the present invention. In step S801, a wafer ID assigning unit 102 assigns a unique wafer ID to each of a plurality of wafers, and registers the wafer IDs in a managing unit 101. The wafer ID assigning unit 102 can assign wafer IDs based on, for example, information input via a user interface. The managing unit 101 registers, for example, wafer IDs 901 of respective wafers on a wafer information managing table illustrated in FIG. 9.

In step S802, a grouping unit 103 divides the plurality of wafers into a plurality of groups, assigns a unique group ID to each group, and registers the group IDs in the managing unit 101. The grouping unit 103 can assign group IDs based on, for example, information input via a user interface. The managing unit 101 registers group IDs 902 on the wafer information managing table illustrated in FIG. 9.

The wafers are generally assigned with serial numbers with which individuals can be identified. By providing the serial numbers to the wafer ID assigning unit 102 via a user interface, the user of the exposure apparatus can use them as wafer IDs. In addition, the user can determine two group IDs based on whether a wafer input to the manufacturing line C 703 has been processed in the manufacturing line A 701 or B 702. By providing the group IDs to the grouping unit 103 via a user interface, the grouping unit 103 registers group IDs based on them. In addition, the grouping unit 103 determines wafer types 903 representing a reference wafer as a representative of the group and other non-reference wafers. The managing unit 101 registers the wafer types in the wafer information managing table illustrated in FIG. 9. In this embodiment, the grouping unit 103 can register a wafer, to be processed first by the exposure apparatus in the manufacturing line C 703, in each group as a reference wafer, and registers wafers, to be processed second and subsequent times, in each group as non-reference wafers. In this embodiment, the managing unit 101 registers "MASTER" on the wafer information managing table as an identifier if the wafer type 903 is a reference wafer, and registers "SLAVE" on the wafer information managing table as an identifier if the wafer type 903 is a non-reference wafer.

In step S803, it is checked whether the wafer to be processed is a reference wafer. If YES in step S803, the process advances to step S804. If NO in step S803, the process advances to step S805.

If the wafer to be processed is a reference wafer, in step S804 a measurement unit 104 measures a first number of measurement points on the reference wafer, and a correction value determining unit 105 determines a first correction value for the reference wafer based on the measurement result. The managing unit 101 registers the first correction value, and an exposure unit 107 exposes the reference wafer to radiant energy while positioning it based on the first correction value.

The managing unit 101 can register a wafer shift correction value 1002, wafer rotation error correction value 1003, wafer magnification error correction value 1004, and wafer orthogonality correction value 1005, illustrated in FIG. 10, as first correction values in association with a wafer ID 1001. Note that the first wafer in each group is the reference wafer in each group, so the reference wafer is always processed first in the group. For example, in a group whose group ID 902 is WFG001, a reference wafer whose wafer ID 901 is WF001 is processed first. WF001, ws001, wr001, wm001, and wo001 can be registered on the wafer correction value managing table as first correction values.

If the wafer to be processed is a non-reference wafer, in step S805 the measurement unit 104 measures a second number (second number<first number) of measurement points on the non-reference wafer, and the correction value determining unit 105 determines a second correction value for the non-reference wafer based on the measurement result. The correction value determining unit 105 notifies the managing unit 101 of the wafer ID of the non-reference wafer to acquire the first correction value for a reference wafer belonging to the same group as the non-reference wafer. For an item which requires a correction value with a higher precision than the second correction value determined by the measurement of the non-reference wafer, the correction value determining unit 105 substitutes the second correction value for the reference wafer for the second correction value determined by the measurement of the non-reference wafer, and performs the final exposure process. The correction value determining unit 105 may determine a second correction value for a non-reference wafer based on the measurement results of the reference wafer and the non-reference wafer.

Figure 11:
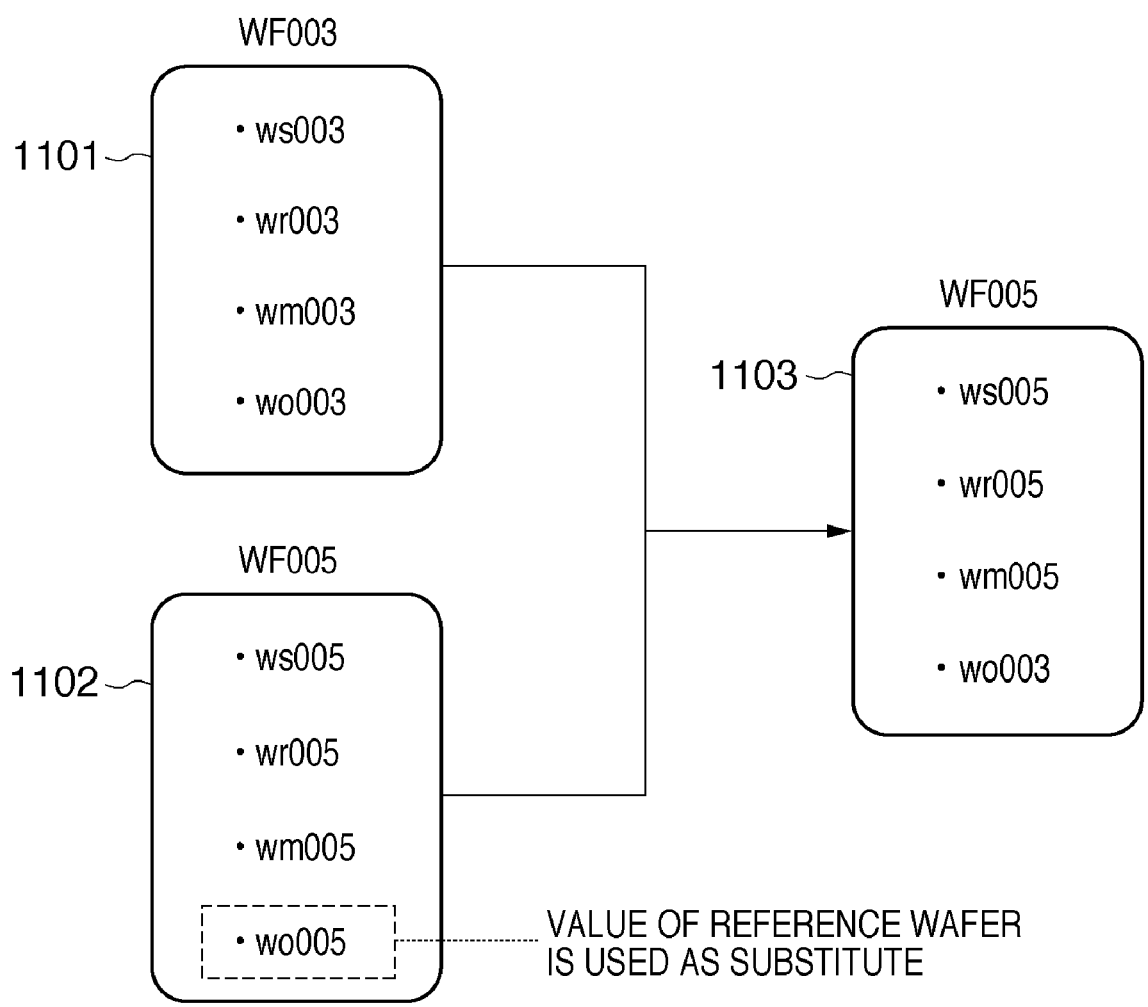
FIG. 11 is a diagram for explaining an example in which a second correction value for a non-reference wafer is determined.

An example in which a second correction value for a non-reference wafer is determined will be explained with reference to FIG. 11. The amount of misalignment of a non-reference wafer 1102 whose wafer ID is WF005 is measured, and a second correction value is determined based on the amount of misalignment herein. First, the measurement unit 104 measures the amount of misalignment of the non-reference wafer 1102, and the correction value determining unit 105 determines a second correction value. A wafer shift correction value ws005, wafer rotation error correction value wr005, wafer magnification error correction value wm005, and wafer orthogonality correction value wo005 are determined as second correction values herein. Next, the correction value determining unit 105 notifies the managing unit 101 of the wafer ID of the non-reference wafer to acquire the first correction value for a reference wafer belonging to the same group as the non-reference wafer.

The managing unit 101 retrieves wafer WF003 serving as a reference wafer having the same group ID as wafer WF005 from the wafer information managing table illustrated in FIG. 9. The managing unit 101 provides a wafer shift correction value ws003, wafer rotation error correction value wr003, wafer magnification error correction value wm003, and wafer orthogonality correction value wo003 for wafer WF003, which are obtained by the measurement of the reference wafer, to the correction value determining unit 105 as first correction values. The correction value determining unit 105 determines a second correction value for a non-reference wafer using the first correction value for the reference wafer.

In this example, the correction value determining unit 105 determines the wafer shift correction value ws005 for non-reference wafer WF005 the wafer rotation error correction value wr005 for non-reference wafer WF005 the wafer magnification error correction value wm005 for non-reference wafer WF005 the wafer orthogonality correction value wo003 for reference wafer WF003 as the final second correction values for non-reference wafer WF005.

The above-mentioned correction value determination method is merely an example. In another example, misalignment measurement and correction value determination for a shot region are performed using a reference wafer alone, and only misalignment amount measurement for the entire wafer is performed using a non-reference wafer. The final correction value can be determined by substituting the correction value for the reference wafer for the correction value for a shot in exposing the non-reference wafer.

As described above, according to this embodiment, the wafers are grouped in accordance with the wafer characteristics, and a reference wafer and non-reference wafers are determined for each group. A second correction value for a non-reference wafer to be processed is determined based on the measurement result of the non-reference wafer and the measurement result of a reference wafer belonging to a group including the non-reference wafer or the first correction value determined based on it. This makes it possible to precisely align the wafers in each group while ensuring a high throughput even when the lot includes groups having different characteristics.

Second Embodiment

The second embodiment of the present invention will be explained with reference to FIGS. 1, 12, 13, 14, and 15.

Figure 12:
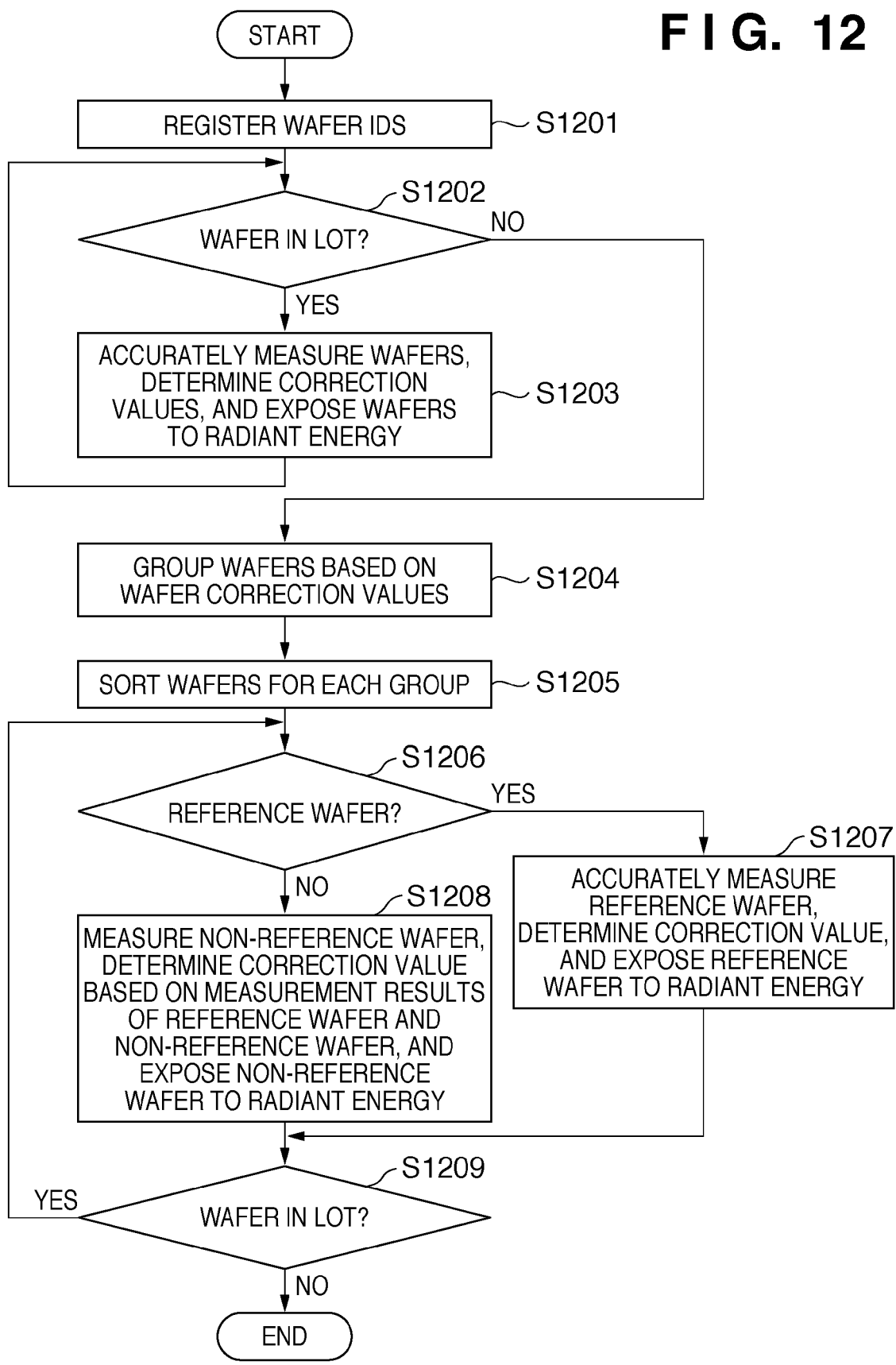
FIG. 12 is a flowchart illustrating an exposure process according to the second embodiment of the present invention.
Figure 13:
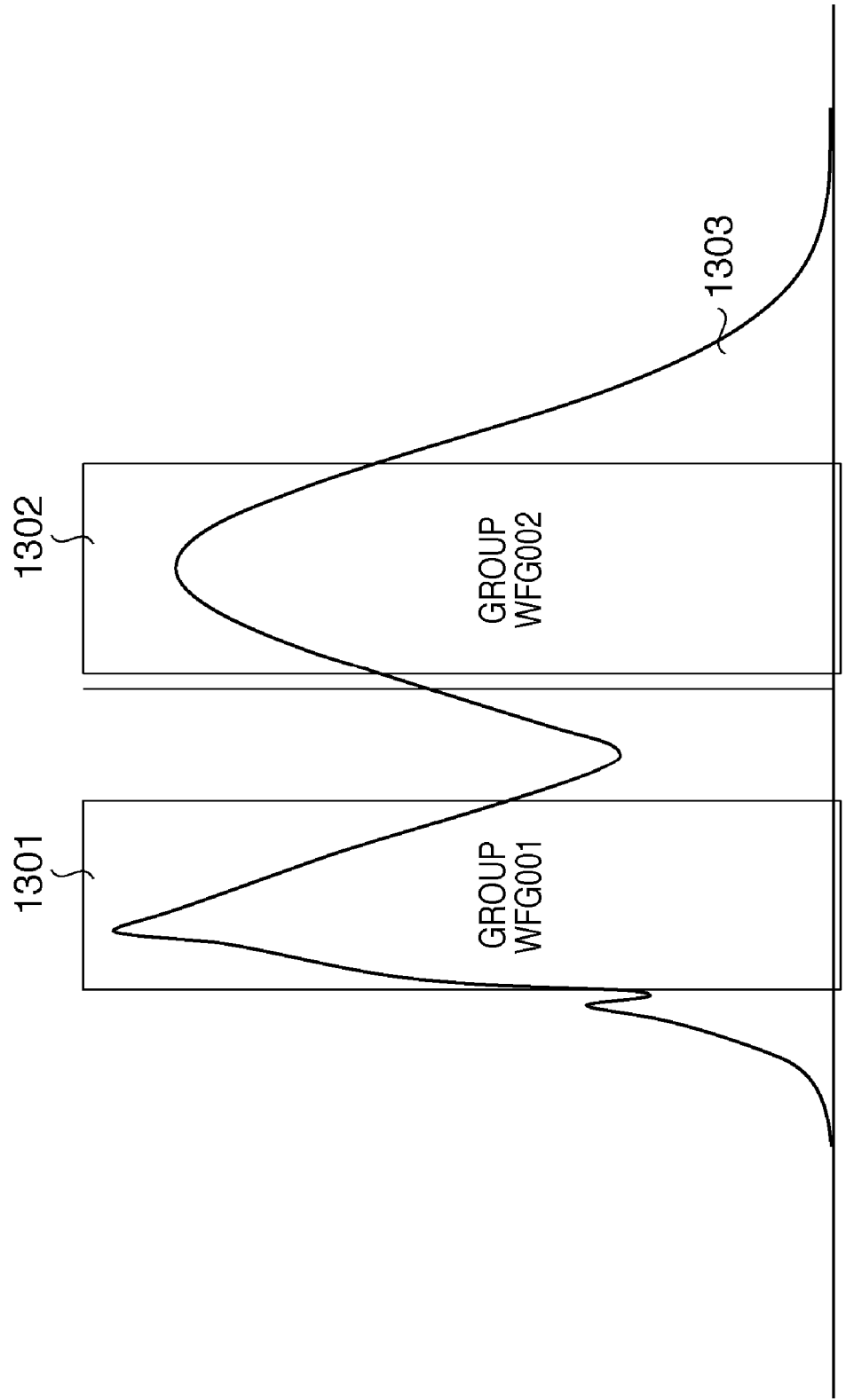
FIG. 13 is a graph illustrating the wafer characteristic distribution.

FIG. 12 is a flowchart illustrating an exposure process according to the second embodiment of the present invention. In step S1201, a wafer ID assigning unit 102 assigns a unique wafer ID to each of a plurality of wafers, and registers the wafer IDs in a managing unit 101. The managing unit 101 registers wafer IDs 1401 of respective wafers on a wafer information managing table illustrated in FIG. 14.

In step S1202, it is checked whether there is a wafer to be processed. If YES in step S1202, the process advances to step S1203. If NO in step S1202, the process advances to step S1204.

In step S1203, a grouping unit 103 accurately measures all wafers in the lot by a measurement unit 104, a correction value determining unit 105 determines correction values for the wafers, and the managing unit 101 registers the correction values. An exposure unit 107 exposes the wafers to radiant energy while positioning them based on the correction values. The managing unit 101 registers a wafer ID 1001, wafer shift correction value 1002, wafer rotation error correction value 1003, wafer magnification error correction value 1004, and wafer orthogonality correction value 1005 on a wafer correction value managing table illustrated in FIG. 10.

In step S1204, the grouping unit 103 groups the wafers in the lot in accordance with the correction value distribution (in other words, the characteristic distribution) by referring to the correction values for the wafers in the lot managed by the managing unit 101, and determines the reference wafer in each group. For example, if the correction value characteristics are bipolarized, as illustrated in a characteristic distribution shown in FIG. 13, groups WFG001 1301 and WFG002 1302 are determined, and a wafer having a most typical characteristic in these groups is determined as a reference wafer. Wafers other than the reference wafer are non-reference wafers, so the non-reference wafers are determined upon determining the reference wafer.

Figures 14, 15:
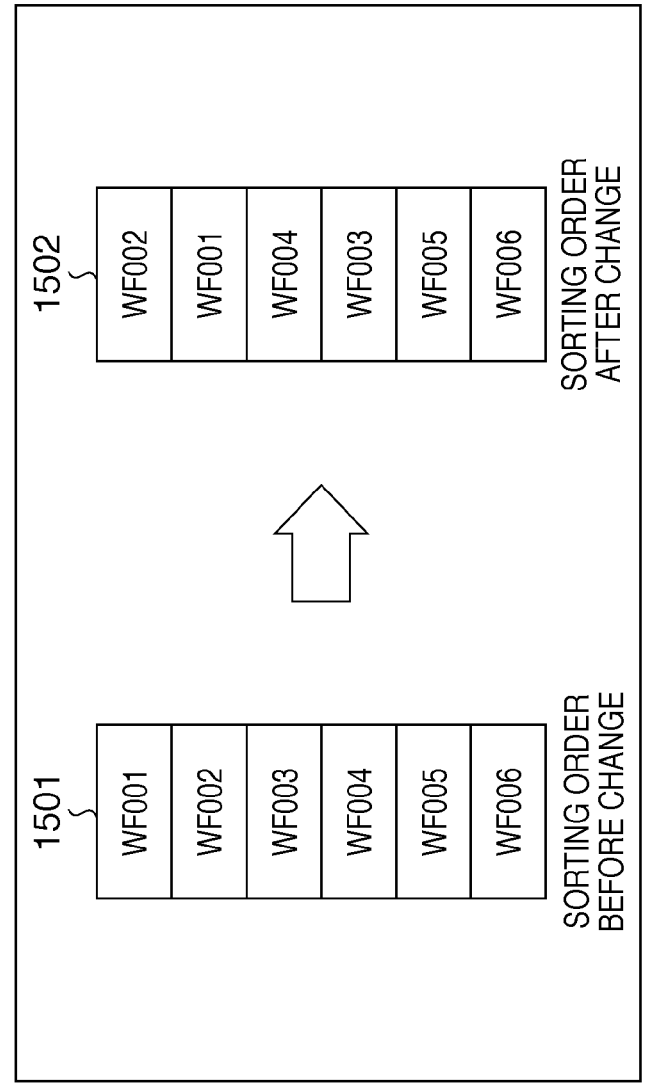
FIG. 14 is a table showing an example of a wafer information managing table managed by a managing unit.
FIG. 15 is a diagram showing an example in which wafers are sorted by a sorting unit.

In the example shown in FIG. 14, group WFG001 includes wafer WF002 as a reference wafer, and wafers WF001 and WF004 as non-reference wafers, and group WFG002 includes wafer WF003 as a reference wafer, and wafer WF005 as a non-reference wafer. The grouping unit 103 registers "OUT" in the managing unit 101 as the group ID of a wafer omitted from the grouping based on the analysis result of the correction value distribution (characteristic distribution), and registers "MASTER" in the managing unit 101 as the wafer type of that wafer.

In step S1205, a sorting unit 106 changes the sorting order of the wafers from a sorting order before change 1501 to a sorting order after change 1502 for each group so that the wafers in the same group are arranged in sequence and the reference wafer comes first in the same group, as shown in FIG. 15. A method which sorts the wafers by the sorting unit 106 will be described herein, and a method which does not sort the wafers will be described later.

The next exposure process is performed for each group. In step S1206, it is checked whether the wafer to be processed is a reference wafer. If YES in step S1206, the process advances to step S1207. If NO in step S1206, the process advances to step S1208.

If the wafer to be processed is a reference wafer, in step S1207 the measurement unit 104 measures a first number of measurement points on the reference wafer, and the correction value determining unit 105 determines a correction value for the reference wafer based on the measurement result. The managing unit 101 registers the correction value, and the exposure unit 107 exposes the reference wafer to radiant energy while positioning it based on the correction value.

If the wafer to be processed is a non-reference wafer, in step S1208 the measurement unit 104 measures a second number (second number<first number) of measurement points on the non-reference wafer. The correction value determining unit 105 determines a correction value for the non-reference wafer based on the measurement result. The correction value determining unit 105 determines a correction value for the non-reference wafer using the correction value for a reference wafer (in other words, an immediately preceding reference wafer) belonging to the same group as the non-reference wafer, and the exposure unit 107 exposes the non-reference wafer to radiant energy.

Note that the wafer type of wafer WF006 omitted from groups WFG001 and WFG002 as the analysis result is a reference wafer. Therefore, the measurement unit 104 measures a first number of measurement points on wafer WF006, and the correction value determining unit 105 determines a correction value for the reference wafer based on the measurement result. The managing unit 101 registers the correction value, and the exposure unit 107 exposes the reference wafer to radiant energy while positioning it based on the correction value.

In the above-mentioned example, an exposure process is performed after sorting the wafers for each group by the sorting unit 106 in step S1205. Differently from this example, a correction value for the reference wafer in a group including a non-reference wafer to be processed may be retrieved from the table registered in the managing unit 101, and a correction value for the reference wafer may be referred to, as has been explained in the first embodiment.

As described above, according to this embodiment, the grouping accuracy can be changed because the wafers are grouped based on the analysis result of the correction values. This makes it possible to improve the precision of a correction value by, for example, narrowing the distribution range in each group, and to improve the throughput in an exposure process by, for example, widening the distribution range in each group.

Application Example

A device manufacturing method using the above-described exposure apparatus will be explained next. Devices (for example, a semiconductor integrated circuit device and liquid crystal display device) are manufactured by a step of exposing a substrate (for example, a wafer or glass plate) coated with a photosensitive agent to radiant energy using the exposure apparatus according to any of the above-described embodiments, a step of developing the substrate exposed in the exposing step, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-054065, filed Mar. 4, 2008, which is hereby incorporated by reference herein in its entirety.

What is claimed is:

1. An exposure apparatus which exposes a substrate to radiant energy, the apparatus comprising:
a grouping unit configured to divide a plurality of substrates into a plurality of groups based on measurements of the plurality of substrates, and determine a reference substrate and a non-reference substrate for each of the plurality of groups;
a measurement unit configured to measure a first number of measurement points for the reference substrate, and measure a second number of measurement points for the non-reference substrate, the second number being smaller than the first number;
a correction value determining unit configured to determine a first correction value to position the reference substrate, and a second correction value to position the non-reference substrate; and
an exposure unit configured to expose the reference substrate to radiant energy by positioning the reference substrate based on the first correction value, and expose the non-reference substrate to radiant energy by positioning the non-reference substrate based on the second correction value,
wherein the correction value determining unit is configured to determine the first correction value for each of the plurality of groups based on measurement for the reference substrate performed by the measurement unit, and determines the second correction value for each of the plurality of groups based on measurement for the non-reference substrate performed by the measurement unit, and one of the measurement for the reference substrate performed by the measurement unit and the first correction value.

2. An apparatus according to claim 1, wherein the grouping unit is configured to divide the plurality of substrates into the plurality of groups based on a characteristic distribution of the plurality of substrates, which is obtained based on the measurements of the plurality of substrates.

3. An apparatus according to claim 1, further comprising a sorting unit configured to sort the plurality of substrates so that the substrates are arranged in sequence and the reference substrate is at a head of the sequence with respect to each of the plurality of groups,
wherein the measurement unit, the correction value determining unit and the exposure unit are configured to perform respective processes for each of the plurality of substrates sorted by the sorting unit.

4. A method of manufacturing a device, the method comprising:
exposing a substrate to radiant energy using an exposure apparatus;
developing the exposed substrate; and
processing the developed substrate to manufacture the device,
wherein the exposure apparatus is configured to expose a substrate to radiant energy, and the comprises:
a grouping unit configured to divide a plurality of substrates into a plurality of groups based on measurements of the plurality of substrates, and determine a reference substrate and a non-reference substrate for each of the plurality of groups;
a measurement unit configured to measure a first number of measurement points for the reference substrate, and measure a second number of measurement points for the non-reference substrate, the second number being smaller than the first number;
a correction value determining unit configured to determine a first correction value to position the reference substrate, and a second correction value to position the non-reference substrate; and
an exposure unit configured to expose the reference substrate to radiant energy by positioning the reference substrate based on the first correction value, and expose the non-reference substrate to radiant energy by positioning the non-reference substrate based on the second correction value,
wherein the correction value determining unit is configured to determine the first correction value for each of the plurality of groups based on measurement for the reference substrate performed by the measurement unit, and determines the second correction value for each of the plurality of groups based on measurement for the non-reference substrate performed by the measurement unit, and one of the measurement for the reference substrate performed by the measurement unit and the first correction value.

5. An exposure apparatus which includes a measurement unit, measures a first number of measurement points for a reference substrate by the measurement unit, measures a second number of measurement points for a non-reference substrate by the measurement unit, the second number being smaller than the first number, determines a first correction value to position the reference substrate, based on measurement for the reference substrate performed by the measurement unit, determines a second correction value to position the non-reference substrate, based on measurement for the non-reference substrate performed by the measurement unit and one of the measurement for the reference substrate performed by the measurement unit and the first correction value, exposes the reference substrate to radiant energy by positioning the reference substrate based on the first correction value, and exposes the non-reference substrate to radiant energy by positioning the non-reference substrate based on the second correction value, the apparatus comprising
    a processor configured to divide a plurality of substrates into a plurality of groups based on measurements of the plurality of substrates, and determine the reference substrate and the non-reference substrate for each of the plurality of groups.

6. A method of manufacturing a device, the method comprising:
    exposing a substrate to radiant energy using an exposure apparatus;
    developing the exposed substrate; and
    processing the developed substrate to manufacture the device,
    wherein the exposure apparatus includes a measurement unit, measures a first number of measurement points for a reference wafer by the measurement unit, measures a second number of measurement points for a non-reference substrate by the measurement unit, the second number being smaller than the first number, determines a first correction value to position the reference substrate, based on measurement for the reference substrate performed by the measurement unit, determines a second correction value to position the non-reference substrate, based on measurement for the non-reference substrate performed by the measurement unit and one of the measurement for the reference substrate performed by the measurement unit and the first correction value, exposes the reference substrate to radiant energy by positioning the reference substrate based on the first correction value, and exposes the non-reference substrate to radiant energy by positioning the non-reference substrate based on the second correction value, and comprises:
    a processor configured to divide a plurality of substrates into a plurality of groups based on measurements of the plurality of substrates, and determine the reference substrate and the non-reference substrate for each of the plurality of groups.

7. An exposure method including
    a first measurement step of measuring a first number of measurement points for a reference substrate,
    a first determination step of determining a first correction value to position the reference substrate, based on measurement for the reference substrate performed in the first measurement step,
    a first exposure step of exposing the reference substrate to radiant energy by positioning the reference substrate based on the first correction value,
    a second measurement step of measuring a second number of measurement points for a non-reference substrate, the second number being smaller than the first number,
    a second determination step of determining a second correction value to position the non-reference substrate, based on measurement for the non-reference substrate performed in the second measurement step, and one of the measurement for the reference substrate performed in the first measurement step and the first correction value, and
    a second exposure step of exposing the non-reference substrate by positioning the non-reference substrate based on the second correction value,
the method comprising
    a grouping step of dividing a plurality of substrates into a plurality of groups based on measurements of the plurality of substrates, and determining the reference substrate and the non-reference substrate for each of the plurality of groups.

* * * * *